United States Patent
Kim

(10) Patent No.: US 10,666,290 B2
(45) Date of Patent: May 26, 2020

(54) DEVICES FOR DECODING INPUT DATA BY USING PATH METRIC AND DECODING METHODS USING THE SAME

(71) Applicant: Samsung Electronics Co., Ltd., Suwon-si, Gyeonggi-do (KR)

(72) Inventor: Dae-son Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/504,733

(22) Filed: Jul. 8, 2019

(65) Prior Publication Data
US 2020/0127680 A1    Apr. 23, 2020

(30) Foreign Application Priority Data
Oct. 19, 2018 (KR) .................. 10-2018-0125404

(51) Int. Cl.
H03M 7/40 (2006.01)
H04L 29/06 (2006.01)
H03M 7/30 (2006.01)

(52) U.S. Cl.
CPC ........... *H03M 7/40* (2013.01); *H03M 7/3059* (2013.01); *H03M 7/6005* (2013.01); *H04L 69/04* (2013.01)

(58) Field of Classification Search
CPC .... H03M 7/40; H03M 7/6005; H03M 7/3059; H04L 69/04
USPC .................................................. 341/50, 51
See application file for complete search history.

(56) References Cited

U.S. PATENT DOCUMENTS

| | | |
|---|---|---|
| 9,191,044 B1 | 11/2015 | Sun et al. |
| 9,319,070 B2 | 4/2016 | Li et al. |
| 9,503,126 B2 | 11/2016 | Vardy et al. |
| 9,819,361 B2 | 11/2017 | Shin et al. |
| 9,941,906 B2 | 4/2018 | Hof et al. |
| 10,491,326 B2 * | 11/2019 | Zhang .................... H03M 13/11 |

(Continued)

FOREIGN PATENT DOCUMENTS

KR    10-1856416    5/2018

OTHER PUBLICATIONS

Alamdar-Yazdi et al. "A Simplified Successive-Cancellation Decoder for Polar Codes" Dec. 2011.

(Continued)

*Primary Examiner* — Brian K Young
(74) *Attorney, Agent, or Firm* — Harness, Dickey & Pierce, P.L.C.

(57) ABSTRACT

A device for decoding input data including first candidate data and second candidate data by using a polar code, the device includes a first path metric processor configured to generate first candidate path metrics based on a first parent path metric by decoding the first candidate data, determine at least one first child path metric among the first candidate path metrics based on first reliability values of the first candidate path metrics; and a second path metric processor configured to generate second candidate path metrics based on a second parent path metric by decoding the second candidate data, and determine at least one second child path metric among the second candidate path metrics based on second reliability values of the second candidate path metrics, a quantity of the at least one first child path metric being different from a quantity of the at least one second child path metric.

20 Claims, 10 Drawing Sheets

(56) References Cited

U.S. PATENT DOCUMENTS

| | | | |
|---|---|---|---|
| 10,498,490 B2 * | 12/2019 | Hui | H04L 1/0057 |
| 10,505,566 B2 * | 12/2019 | Saber | H03M 13/13 |
| 10,505,674 B2 * | 12/2019 | Shen | H04L 1/00 |
| 2017/0366204 A1 | 12/2017 | Shi et al. | |
| 2018/0248564 A1 | 8/2018 | Kim et al. | |

OTHER PUBLICATIONS

Sarkis et al. "Fast Polar Decoders: Algorithm and Implementation" Dec. 9, 2013.

\* cited by examiner

DEVICES FOR DECODING INPUT DATA BY USING PATH METRIC AND DECODING METHODS USING THE SAME

CROSS-REFERENCE TO RELATED APPLICATION

This application claims the benefit of Korean Patent Application No. 10-2018-0125404, filed on Oct. 19, 2018, in the Korean Intellectual Property Office, the disclosure of which is incorporated herein in its entirety by reference.

BACKGROUND

The inventive concepts relate to data decoding, and more particularly, to a devices for decoding input data by using different numbers of child path metrics and a decoding methods using the device.

In wireless communication systems, channel encoding and decoding may be performed to improve the reliability of data transmission. Channel encoding/decoding methods utilizing polar codes may achieve Shannon capacity with low encoding/decoding complexity. By using channel polarization by which bit channels (or subchannels) are polarized into good bit channels and bad bit channels, a polar code may transmit frozen bits having values (for example, zero), known to both an encoder and a decoder, via bad bit channels while transmitting information bits via good bit channels.

SUMMARY

The inventive concepts provide a device for decoding input data by using different numbers of child path metrics based on reliabilities of parent path metrics and a decoding method using the device.

According to an aspect of the inventive concepts, there is provided a device for decoding input data including first candidate data and second candidate data by using a polar code. The device includes a first path metric processor configured to generate a plurality of first candidate path metrics based on a first parent path metric by decoding the first candidate data, determine at least one first child path metric from among the plurality of first candidate path metrics based on first reliability values of the plurality of first candidate path metrics; and a second path metric processor configured to generate a plurality of second candidate path metrics based on a second parent path metric by decoding the second candidate data, and determine at least one second child path metric from among the plurality of second candidate path metrics based on second reliability values of the plurality of second candidate path metrics, a quantity of the at least one first child path metric being different from a quantity of the at least one second child path metric.

According to another aspect of the inventive concepts, there is provided a device for decoding input data including a plurality of pieces of candidate data by using a polar code. The device includes a plurality of path metric processors, each configured to determine at least one child path metric from among a plurality of candidate path metrics based on reliability values of the plurality of candidate path metrics the plurality of candidate path metrics being generated from a parent path metric by decoding at least one of the plurality of pieces of candidate data; and a path metric sorter configured to output a plurality of path metrics selected from among a plurality of child path metrics received from the plurality of path metric processors, a quantity of at least one first child path metric received from a first path metric processor among the plurality of path metric processors being equal to or greater than a quantity of child path metrics received from each of the plurality of path metric processors exclusive of the first path metric processor, and a quantity of the plurality of child path metrics received by the path metric sorter being less than a product of the quantity of the at least one first child path metric and a quantity of the plurality of path metric processors.

According to yet another aspect of the inventive concepts, there is provided a method of decoding input data by using a polar code. The method includes determining at least one first child path metric from a plurality of first candidate path metrics generated based on a first parent metric, the first parent metric having a first reliability value representing a degree of correspondence of the first parent metric to a bit sequence output from a transmission stage. The method also includes determining at least one second child path metric from a plurality of second candidate path metrics generated based on a second parent metric, the second parent metric having a second reliability value representing a degree of correspondence of the second parent metric to a bit sequence output from a transmission stage, the first reliability value being higher than the second reliability value, and a quantity of the at least one first child path metric being greater than a quantity of the at least one second child path metric.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
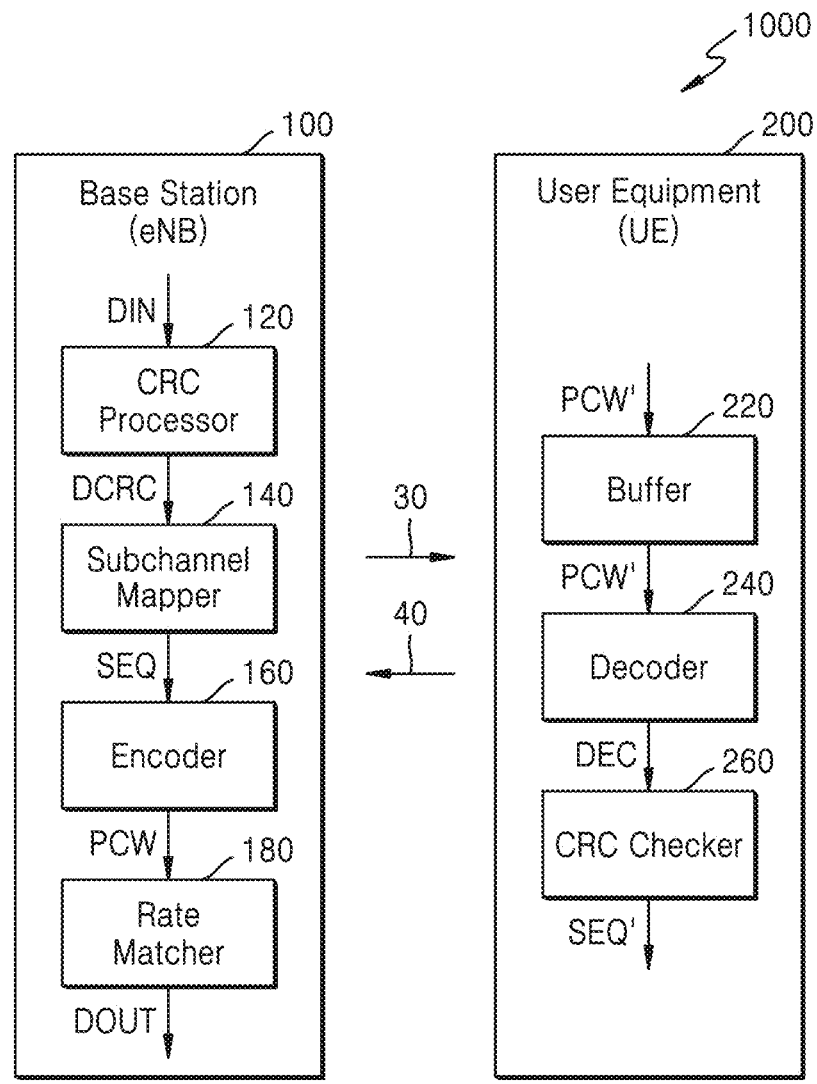
FIG. 1 is a block diagram illustrating a wireless communication system according to example embodiments.

FIG. 1 is a block diagram illustrating a wireless communication system according to example embodiments. A wireless communication system 1000 may include, as a non-limiting example, a 5$^{th}$ generation (5G) wireless system, a long term evolution (LTE) system, a code division multiple access (CDMA) system, a global system for mobile communications (GSM) system, a wireless local area network (WLAN) system, and/or any other wireless communication system.

A base station 100 may generally refer to a fixed station communicating with user equipment and/or another base station, and may exchange data and/or control information by communicating with the user equipment and/or the other base station. For example, the base station 100 may be referred to as a Node B, an evolved-Node B (eNB), a sector, a site, a base transceiver system (BTS), an access point (AP), a relay node, a remote radio head (RRH), a radio unit (RU), a small cell, and/or the like. Herein, the base station 100 and/or a cell may be interpreted as meaning a partial region and/or function covered by a base station controller (BSC) in CDMA, a Node-B in WCDMA, an eNB or sector (site) in LTE, and/or the like, and may encompass all of various coverage regions such as mega-cell, macro-sell, micro-cell, pico-cell, femto-cell, relay node, RRH, RU, and/and small cell communication ranges.

User equipment 200 is wireless communication equipment, and may refer to various equipment which may be fixed or mobile and may also transmit and/or receive data and/or control information by communicating with the base station 100. For example, the user equipment 200 may be referred to as terminal equipment, a mobile station (MS), a mobile terminal (MT), a user terminal (UT), a subscriber station (SS), a wireless device, a handheld device, a mobile device, and/or the like.

A wireless communication network between the base station 100 and the user equipment 200 may support communication between a large number of users by sharing available network resources. For example, in the wireless communication network, information may be transferred in various multiple-access manners such as CDMA, frequency division multiple access (FDMA), time division multiple access (TDMA), orthogonal frequency division multiple access (OFDMA), single carrier frequency division multiple access (SC-FDMA), OFDM-FDMA, OFDM-CDMA, and/or the like.

The base station 100 and the user equipment 200 may communicate with each other via a downlink 30 and/or an uplink 40. For example, in a wireless system such as a 5G new radio (NR) system, an LTE system, and/or an LTE-Advanced system, the downlink 30 and/or the uplink 40 may transmit control information via a control channel such as a physical downlink control channel (PDCCH), a physical control format indicator channel (PCFICH), a physical hybrid automatic repeat request (ARQ) indicator channel (PHICH), a physical uplink control channel (PUCCH), and/or an enhanced physical downlink control channel (EP-DCCH), and/or may transmit data via a data channel such as a physical downlink shared channel (PDSCH) and/or a physical uplink shared channel (PUSCH).

Herein, transmitting or receiving a signal via a physical control channel such as a PUCCH, a PUSCH, a PDCCH, an EPDCCH, or a PDSCH may be expressed as "transmitting or receiving a PUCCH, a PUSCH, a PDCCH, an EPDCCH, or a PDSCH". In addition, transmitting or receiving a PDCCH or transmitting or receiving a signal via a PDCCH may include transmitting or receiving an EPDCCH or transmitting or receiving a signal via an EPDCCH. That is, a physical downlink control channel may include a PDCCH, a EPDCCH, or both of the PDCCH and the EPDCCH.

In the wireless communication system 1000, to improve the reliability of data transmission via the downlink 30 and/or the uplink 40, channel encoding may be used. For example, in the wireless communication system 1000, a polar code may be used for channel encoding, and each of the base station 100 and the user equipment 200 may include an encoder and a decoder both for the polar code. The polar code may be based on channel polarization referring to a phenomenon by which bit channels (or subchannels) observed in inputs are polarized into good bit channels and bad bit channels. Thus, in the polar code, information bits based on input data DIN may be allocated to good bit channels, whereas frozen bits having values known to both of the encoder and the decoder may be allocated to bad bit channels.

Referring to FIG. 1, the base station 100 may include a cyclic redundancy check (CRC) processor 120, a subchannel mapper 140, an encoder 160, and a rate matcher 180, and the user equipment 200 may include a buffer 220, a decoder 240, and a CRC checker 260. Although examples, in which the base station 100 encodes data in the process of transmitting signals to the user equipment 200 via the downlink 30 and the user equipment 200 decodes data in the process of receiving signals from the base station 100 via the downlink 30, are mainly described hereinafter, it will be understood that example embodiments of the inventive concepts may also be applied to examples in which the user equipment 200 transmits signals to the base station 100 via the uplink 40 and the base station 100 receives signals from the user equipment 200 via the uplink 40. For example, although not shown in FIG. 1, the base station 100 may include a decoder and the user equipment 200 may include an encoder. Components of each of the base station 100 and the user equipment 200 (e.g., the cyclic redundancy check (CRC) processor 120, the subchannel mapper 140, the encoder 160, the rate matcher 180, the buffer 220, the decoder 240, and/or the CRC checker 260) may be implemented as hardware blocks implemented by logic synthesis or the like in some example embodiments, may be implemented as a processor and software blocks executed by the processor in some example embodiments, and may be implemented as combinations of hardware blocks, a processor, and software blocks in some example embodiments. For example, the components of each of the base station 100 and the user equipment 200 may be implemented using processing circuitry. The term "processing circuitry," as used in the present disclosure, may refer to hardware and/or a combination of hardware and software. For example, the processing circuitry may include a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions (e.g., computer-readable instructions) in a defined manner.

The CRC processor 120 may generate CRC bits of the input data DIN and may generate CRC data DCRC including the input data DIN and the CRC bits. For example, the CRC processor 120 may generate (K+J) bits of the CRC data DCRC by adding J bits of the CRC bits to K bits of the input data DIN (where each of K and J is a natural number). Herein, the CRC data DCRC may be referred to as information bits including input bits and CRC bits of the input data DIN. The CRC bits may be used to check if there are errors in data received by the user equipment 200, and the CRC processor 120 may generate the CRC bits in an arbitrary manner based on the wireless communication system 1000.

The subchannel mapper 140 may generate a bit sequence SEQ from the CRC data DCRC, the bit sequence SEQ being an input of the encoder 160. In some example embodiments, the subchannel mapper 140 may generate unfrozen bits from the CRC data DCRC and may generate the bit sequence SEQ by rearranging the unfrozen bits and frozen bits.

The bit sequence SEQ is the input of the encoder 160 that generates a polar-encoded codeword PCW, and indices of the bit sequence SEQ may correspond to polarized subchannels of the polar code. Thus, the subchannel mapper 140 may recognize good subchannels (or good bit channels) and bad subchannels (bad bit channels) based on the indices and may generate the bit sequence SEQ by allocating the unfrozen bits, including the information bits, to the polarized subchannels having higher reliability than the polarized subchannels to which the frozen bits are allocated. Thus, the information bits included in the unfrozen bits may be allocated to the polarized subchannels having relatively high reliability.

The encoder 160 may generate the polar-encoded codeword PCW by processing the bit sequence SEQ. The subchannel mapper 140 and the encoder 160, which generate the polar-encoded codeword PCW from the CRC data DCRC, may be collectively referred to as an encoder.

The rate matcher 180 may generate output data DOUT by rate-matching the polar-encoded codeword PCW. The rate matcher 180 may perform rate matching by performing a method particular to the wireless communication system 1000, for example, the method may include at least one of repetition, puncturing, or shortening, on the polar-encoded codeword PCW. The output data DOUT rate-matched by the rate matcher 180 may be converted by sequentially passing through a modulator, a mixer, a power amplifier, an antenna, and/or the like in this stated order and may be transferred to the user equipment 200 via the downlink 30.

The user equipment 200 may receive, via the downlink 30, signals transmitted by the base station 100. For example, the user equipment 200 may convert data by passing the data through an antenna, a filter, a low noise amplifier, an analog-to-digital converter, and/or the like, the converted data may be stored as a polar-encoded codeword PCW' (also referred to herein as "candidate data") in the buffer 220, and the polar-encoded codeword PCW' stored in the buffer 220 may be transferred to the decoder 240. The decoder 240 may generate decoded data DEC by decoding the polar-encoded codeword PCW'.

In example embodiments, the decoder 240 may sequentially decode the polar-encoded codeword PCW' bitwise based on successive cancellation decoding. In some example embodiments, the decoder 240 may decode the polar-encoded codeword PCW' while maintaining a plurality of path metrics based on list decoding and discarding the path metrics according to maximum likelihood. As used herein, the term "path metric" may refer to a list that may be a candidate for a bit sequence in list decoding, and the term "successive cancellation list decoding" may refer to a combination of successive cancellation decoding and list decoding.

A method of reducing calculation complexity by sorting nodes in a decoding tree into determined groups (for example, simplified successive cancellation (SSC) decoding) may be used, and in some example embodiments, a method of cascading a CRC code and a polar code to improve the performance of successive cancellation list decoding may be used. The decoding methods set forth above are merely examples, and it should be noted that example embodiments of the inventive concepts are not limited to the decoding methods set forth above.

According to the successive cancellation list decoding, the decoder 240 may generate the decoded data DEC by decoding candidate data according to a path. In one example, the decoder 240 may repeat a process in which candidate path metrics are generated from a parent path metric by decoding the candidate data and a determined number of child path metrics are selected from among the generated candidate path metrics. As used herein, the term "parent path metric" may refer to a path metric before decoding candidate data, and the term "child path metric" may refer to a path metric generated from a parent path metric as a result of decoding candidate data.

According to example embodiments, the decoder 240 may determine different numbers of child path metrics based on reliabilities of parent path metrics, the child path metrics being generated as a result of decoding candidate data. In example embodiments, the decoder 240 may generate more child path metrics from a parent path metric having high reliability, and thus, the reliability of the decoded data DEC generated as a result of decoding may be improved. In addition, in example embodiments, the decoder 240 may reduce the number of child path metrics generated from a parent path metric having low reliability, and as physical resources used for decoding, such as the area in a chip used by the decoder 240, may be reduced.

The decoded data DEC decoded by the decoder 240 may be processed by the CRC checker 260. The CRC checker 260 may check if there are errors in the decoded data DEC by using the CRC bits. When there are no errors in the decoded data DEC through the CRC check for the decoded data DEC, the CRC checker 260 may output a bit sequence SEQ' having no errors.

Figure 2:
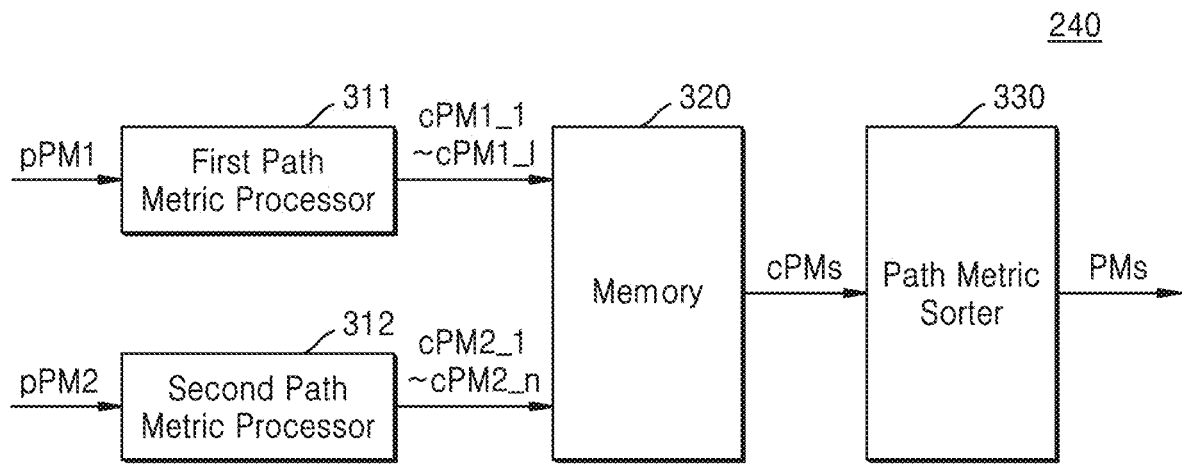
FIG. 2 is a block diagram illustrating a decoder according to example embodiments.

FIG. 2 is a block diagram illustrating a decoder according to example embodiments. Repeated descriptions given with reference to FIG. 1 will be omitted.

Referring to FIG. 2, the decoder 240 may include a first path metric processor 311, a second path metric processor 312, memory 320, and a path metric sorter 330. According to some example embodiments, the first path metric processor 311, the second path metric processor 312, and/or the path metric sorter 330 may be implemented using processing circuitry.

The first path metric processor 311 may receive a first parent path metric pPM1. In example embodiments, the first path metric processor 311 may receive the first parent path metric pPM1 from the buffer 220 (FIG. 1) or may receive, as the first parent path metric pPM1, a path metric generated through a previous decoding operation from the path metric sorter 330. The first path metric processor 311 may generate l first child path metrics cPM1_1 to cPM1_$l$ (where l is a natural number) from the first parent path metric pPM1 by decoding the candidate data (e.g., first candidate data). The first path metric processor 311 may store the generated l first child path metrics cPM1_1 to cPM1_$l$ in the memory 320.

The second path metric processor 312 may receive a second parent path metric pPM2. The second path metric processor 312 may generate n second child path metrics cPM2_1 to cPM2_$n$ (where n is a natural number) from the second parent path metric pPM2 by decoding the candidate data (e.g., second candidate data). The second path metric processor 312 may store the generated n second child path metrics cPM2_1 to cPM2_$n$ in the memory 320.

According to example embodiments, the first parent path metric pPM1 and the second parent path metric pPM2 may have different reliability values from each other, and the first path metric processor 311 and the second path metric processor 312 may generate different numbers of child path metrics based on the reliability values. In example embodiments, the first parent path metric pPM1 may have a higher reliability value than the second parent path metric pPM2, and the number (e.g., quantity) of first child path metrics cPM1_1 to cPM1_$l$ (that is, l) may be greater than the number of second child path metrics cPM2_1 to cPM2_$n$ (that is, n).

As used herein, the term "reliability of a path metric" may refer to a degree of correspondence of a path metric to a bit sequence output from a transmission stage, and there may be a high probability that similar or identical data to a bit sequence output from a transmission stage is recovered from a path metric having high reliability. In example embodiments, a reliability value of a path metric may be generated based on a log likelihood ratio (LLR) of each of bits included in the path metric. In example embodiments, a reliability value of a path metric may be calculated as a sum of LLRs.

The memory 320 may store a plurality of child path metrics cPMs. In example embodiments, the plurality of child path metrics cPMs may include the l first child path metrics cPM1_1 to cPM1_$l$ and the n second child path metrics cPM2_1 to cPM2_$n$ and thus may include l+n child path metrics in total.

The memory 320 may include a volatile memory device such as static random access memory (SRAM), dynamic random access memory (DRAM), a latch, a flip-flop, and/or a register and/or a non-volatile memory device such as NAND flash memory (NAND), vertical NAND, NOR flash memory, resistive RAM, phase-change memory, and/or magnetoresistive RAM. Herein, although the memory 320 is described as a register storing the plurality of child path metrics cPMs, the inventive concepts are not limited thereto.

The path metric sorter 330 may select a plurality of path metrics PMs from the plurality of child path metrics cPMs including the l+n child path metrics. In example embodiments, the path metric sorter 330 may calculate reliability values of the plurality of child path metrics cPMs and may output m path metrics PMs (where m is a natural number) having high reliability values from the plurality of child path metrics cPMs. In example embodiments, the number of path metrics PMs may correspond to the number of path metric processors 311 and 312.

The path metric sorter 330 may allow CRC checking to be performed by outputting decoding results of pieces of candidate data corresponding to the plurality of path metrics PMs to the CRC checker 260 (FIG. 1) or may allow decoding to be performed again by respectively outputting the decoding results to the path metric processors 311 and 312. In example embodiments, when outputting the plurality of path metrics PMs to the path metric processors 311 and 312, the path metric sorter 330 may arrange (e.g., rank or sort) the plurality of path metrics PMs based on reliability values thereof and may respectively output the plurality of path metrics PMs to the corresponding path metric processors 311 and 312 (e.g., based on rank or order).

According to the inventive concepts, the path metric processors 311 and 312 may generate different numbers of child path metrics cPM1_1 to cPM1_$l$ and cPM2_1 to cPM2_$n$ according to the reliability values of the parent path metrics pPM1 and pPM2, respectively. In example embodiments, each of the path metric processors 311 and 312 may generate more child path metrics from a parent path metric having higher reliability, and the reliability of each of the plurality of path metrics PMs generated as a result of decoding may be improved.

Although one first path metric processor 311 and one second path metric processor 312 are shown in FIG. 2, this is merely an example simplified for convenience, and the decoder 240 may include a plurality of first path metric processors 311 and a plurality of second path metric processors 312. This will be described with reference to FIG. 11.

Figure 3:
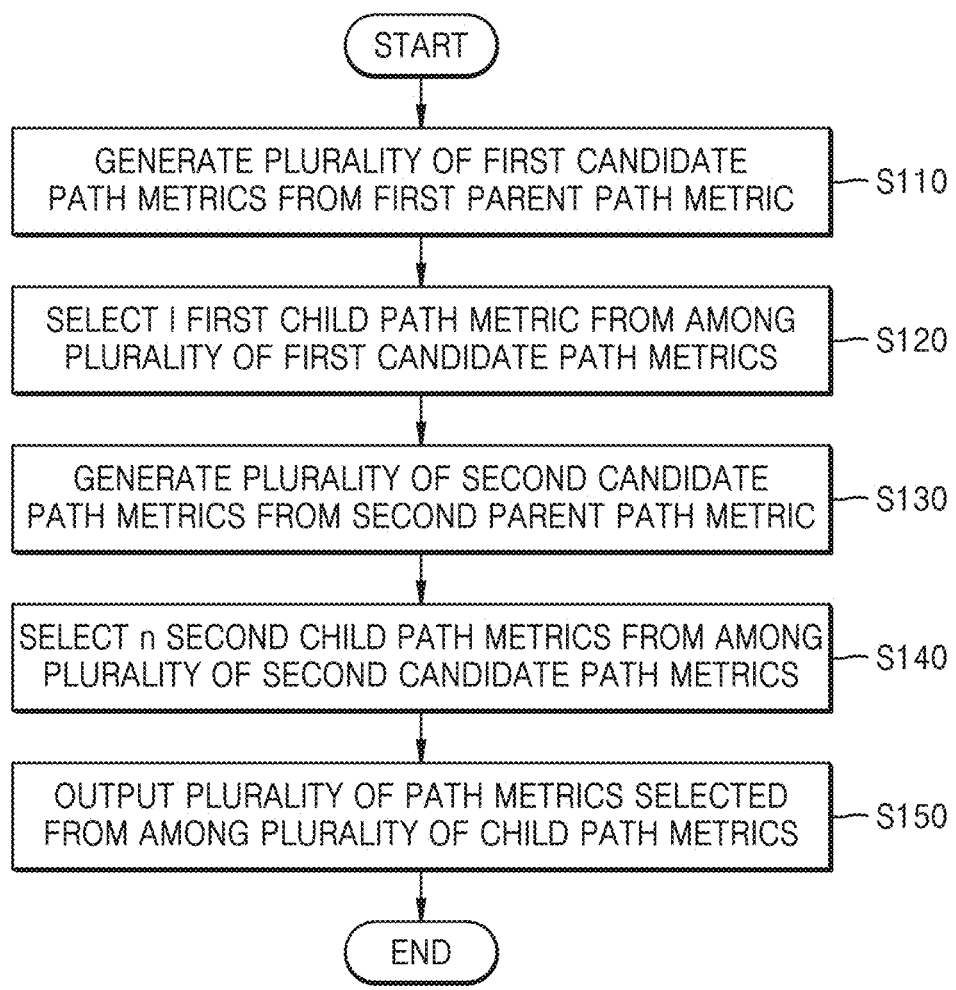
FIG. 3 is a flowchart illustrating a method of operating a decoder, according to example embodiments.

FIG. 3 is a flowchart illustrating a method of operating a decoder, according to example embodiments.

Referring to FIGS. 2 and 3, the decoder 240 may generate a plurality of first candidate path metrics from the first parent path metric pPM1 by decoding candidate data (S110). The decoder 240 may select the l first child path metric cPM1_1 to cPM1_$l$ from among the plurality of first candidate path metrics based on reliability values of the plurality of first candidate path metrics (S120). The decoder 240 may generate a plurality of second candidate path metrics from the second parent path metric pPM2 by decoding the candidate data (S130). The decoder 240 may select the n second child path metrics cPM2_1 to cPM2_$n$ from among the plurality of second candidate path metrics based on reliability values of the plurality of second candidate path metrics (S140). The decoder 240 may output the plurality of path metrics PMs selected from among a plurality of child path metrics cPM1_1 to cPM1_$l$ and cPM2_1 to cPM2_$n$ based on reliability values of the plurality of child path metrics cPM1_1 to cPM1_$l$ and cPM2_1 to cPM2_$n$ (S150).

Figure 4:
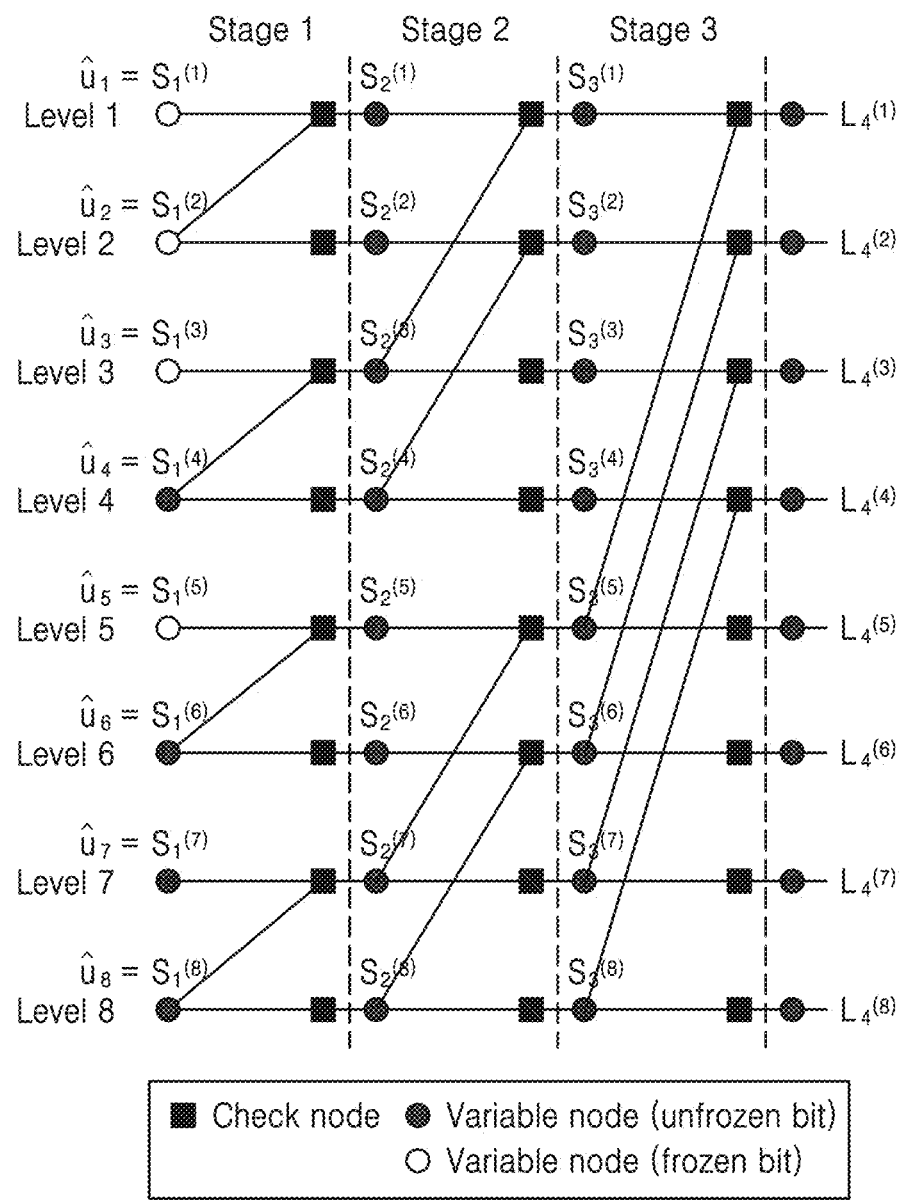
FIG. 4 is a diagram illustrating operations of a decoder, according to example embodiments.

FIG. 4 is a diagram illustrating operations of a decoder, according to example embodiments. Specifically, FIG. 4 illustrates a trellis of a polar code having N=8.

Referring to FIG. 4, each of a plurality of estimated bits corresponding to variable nodes may be represented by $s_j^{(i)}$, where i and j (1≤i≤n+1, 1≤j≤N) may respectively represent a level and a stage of the trellis. $L_j^{(i)}$, which is an LLR of $s_j^{(i)}$, may be calculated by Mathematical Equation 1.

[Mathematcal Equation 1]

$$L_j^{(i)} = \begin{cases} 2\tanh^{-1}\left[\tanh\left(\frac{L_{j+1}^{(i)}}{2}\right) \cdot \tanh\left(\frac{L_{j+1}^{(i+2^{j-1})}}{2}\right)\right] & \text{if } \left\lfloor \frac{i-1}{2^{j-1}} \right\rfloor \bmod 2 = 0 \\ \left(1 - 2s_j^{(i-2^{j-1})}\right)\left(L_{j+1}^{(i-2^{j-1})}\right) + L_{j+1}^{(i)} & \text{otherwise} \end{cases}$$

A bit sequence $\{\hat{u}_1, \ldots, \hat{u}_N\}$ estimated in successive cancellation decoding may be represented by Mathematical Equation 2, based on Mathematical Equation 1.

[Mathematical Equation 2]

$$\hat{u}_i = \begin{cases} u_i & \text{for } i = \text{index of frozen bit} \\ s_1^{(i)} & \text{for } i = \text{index of unfrozen bit} \end{cases}$$

In addition, $s_1^{(i)}$ in Mathematical Equation 2 may be represented by Mathematical Equation 3.

[Mathematical Equation 3]

$$s_1^{(i)} = \begin{cases} 0 & \text{if } L_1^{(i)} \geq 1 \\ 1 & \text{otherwise} \end{cases}$$

For the bit sequence $\{\hat{u}_1, \ldots, \hat{u}_N\}$ and the LLR $L_j^{(i)}$ described above, a path metric $PM_i^{(i)}$ may be represented by Mathematical Equation 4.

[Mathematical Equation 4]

$$PM_l^{(i)} \triangleq \sum_{j=0}^{i} \ln\left(1 + \exp-\left((1 - 2\hat{u}_j[l]) \cdot L_1^{(j)}[l]\right)\right)$$

Figure 5A:
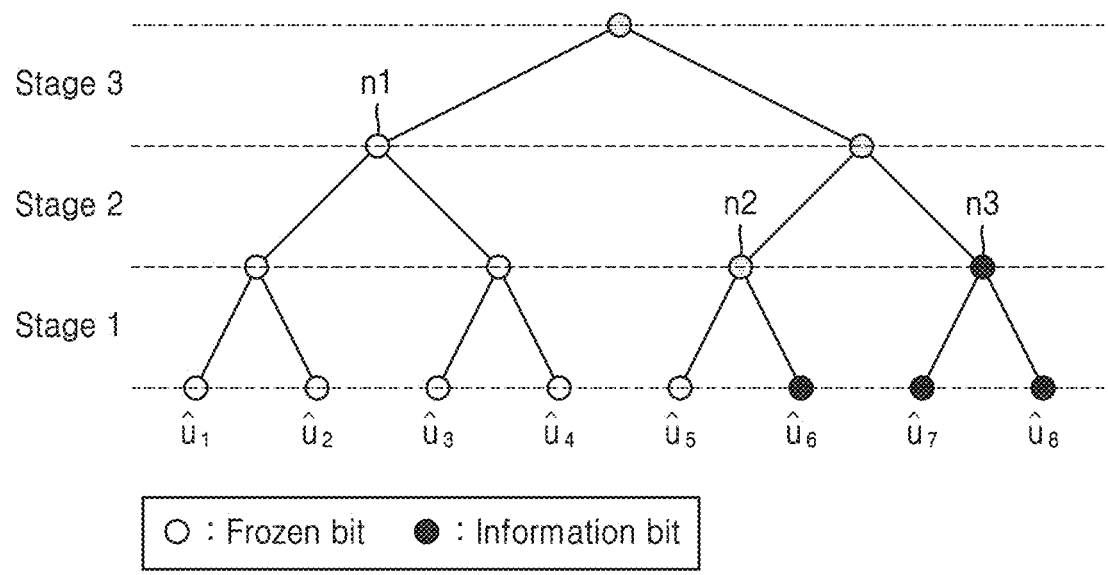
FIGS. 5A and 5B are diagrams respectively illustrating operations of decoders binary tree structures for representative of, according to example embodiments.
Figure 5B:
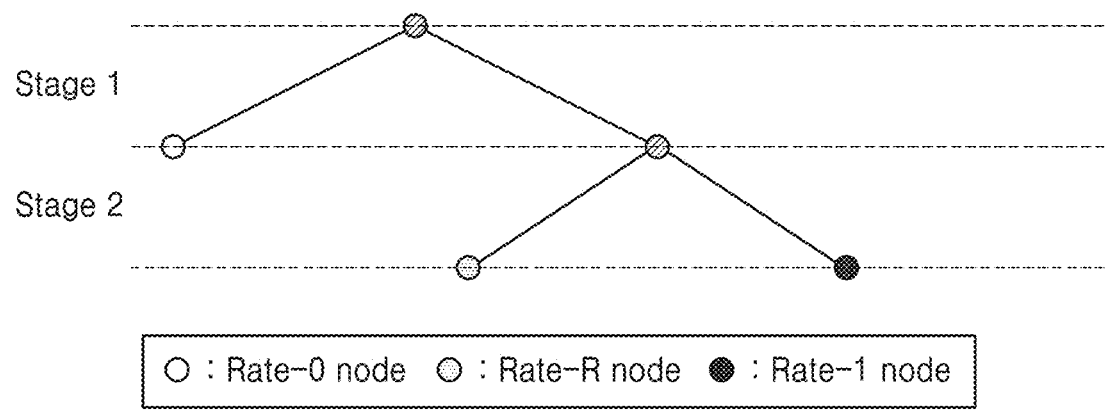

FIGS. 5A and 5B are diagrams respectively illustrating binary tree structures for representative of operations of decoders, according to example embodiments. In particular, FIG. 5A illustrates a binary tree structure according to successive cancellation list decoding using a polar code, and FIG. 5B illustrates a binary tree structure simplified from the binary tree structure of FIG. 5A.

Referring to FIG. 5A, successive cancellation decoding may be represented by a binary tree having a depth of n when $2^n=N$. For example, as shown in FIG. 5A, a trellis may be represented by a binary tree having a depth of 3 and having $2^3=8$ leaf nodes. Nodes in a binary tree may be classified according to features thereof. For example, as shown in FIG. 5A, the nodes in the binary tree may be classified into Rate-0 nodes having only frozen bits as child nodes, Rate-1 nodes having only information bits as child nodes, and Rate-R nodes having, as child nodes, one information bit located at a most trailing end (the last bit) and frozen bits. In one example, all nodes grouped by specific feature, such as Rate-SPC nodes in which only a first leaf node is a frozen bit and all of the remaining leaf nodes are information bits, may be considered. In the example depicted by FIG. 5A, bits included in a first leaf node $\hat{u}_1$ to a fifth leaf node $\hat{u}_5$ may be frozen bits, and bits included in a sixth leaf node $\hat{u}_6$ to an eighth leaf node $\hat{u}_8$ may be information bits. In the case of a first node n1, since all child nodes $\hat{u}_1$ to $\hat{u}_4$ are frozen bits, the first node n1 may be a Rate-0 node. In the case of a second node n2, since a most-trailing-end child node $\hat{u}_6$ is an information bit and the remaining child node $\hat{u}_5$ is a frozen bit, the second node n2 may be a Rate-R node. In the case of a third node n3, since all child nodes $\hat{u}_7$ and $\hat{u}_8$ are information bits, the third node n3 may be a Rate-1 node.

Referring to FIG. 5B, a subtree including similarly or identically classified nodes may be substituted with one node of a similar or the same kind as the nodes set forth above, and thus, the binary tree may be simplified as shown in FIG. 5B. For example, the successive cancellation decoding may be simplified due to the simplified binary tree. In one example, when decoding a Rate-0 node, a decoder may generate one path metric processing all frozen bits as '0', and when decoding a Rate-R node, the decoder may generate two path metrics according to an information bit. When decoding a Rate-1 node, the decoder may generate a plurality of path metrics according to processing of information bits.

Figure 6:
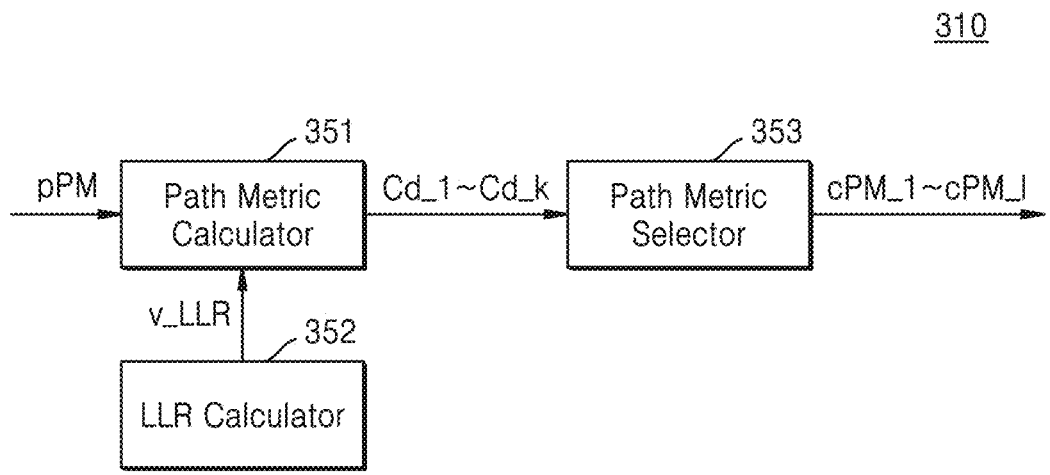
FIG. 6 is a block diagram illustrating a path metric processor according to example embodiments.

FIG. 6 is a block diagram illustrating a path metric processor according to example embodiments.

Referring to FIG. 6, a path metric processor 310 may include a path metric calculator 351, an LLR calculator 352, and a path metric selector 353. The path metric processor 310 may be one or more of the first path metric processor 311, the second path metric processor 312, which have been described with reference to FIG. 2, and/or a third path metric processor 313 described with reference to FIG. 10 below. According to some example embodiments, the path metric calculator 351, the LLR calculator 352, and/or the path metric selector 353 may be implemented using processing circuitry.

The LLR calculator 352 may perform LLR calculation and/or decoding on a corresponding level or node and thereby output a calculated LLR value v_LLR to the path metric calculator 351. In example embodiments, the LLR calculator 352 may calculate an LLR by the method described with reference to FIG. 4. In example embodiments, the LLR calculator 352 may generate a plurality of candidate paths by performing LLR calculation and decoding on a corresponding level and may generate candidate path metrics Cd_1 to Cd_k corresponding thereto. The path metric selector 353 may select (e.g., determine) a plurality of child path metrics from among k candidate path metrics Cd_1 to Cd_k based on reliability values of the k candidate path metrics Cd_1 to Cd_k.

The path metric calculator 351 may receive a parent path metric pPM and the LLR value v_LLR and may generate the k candidate path metrics Cd_1 to Cd_k (where k is a natural number greater than 2) based on the LLR value v_LLR. For example, the parent path metric pPM may be a path metric for the Rate-1 node described with reference to FIG. 5B. The path metric calculator 351 may output the candidate path metrics Cd_1 to Cd_k generated for the k candidates to the path metric selector 353.

In example embodiments, the path metric selector 353 may select l child path metrics cPM_1 to cPM_l (where l is a natural number less than or equal to k) from among the k candidate path metrics Cd_1 to Cd_k based on reliability values of the k candidate path metrics Cd_1 to Cd_k. According to example embodiments, for each path metric processor 310, the number of candidate path metrics Cd_1 to Cd_k (that is, k) generated by the path metric calculator 351 may be different from the number of child path metrics cPM_1 to cPM_l (that is, l) selected by the path metric selector 353, according to a reliability value of the parent path metric pPM. In example embodiments in which the number of candidates (that is, k) is equal to the number of child path metrics (that is, l), the path metric selector 353 may not be included in the path metric processor 310.

Figure 7:
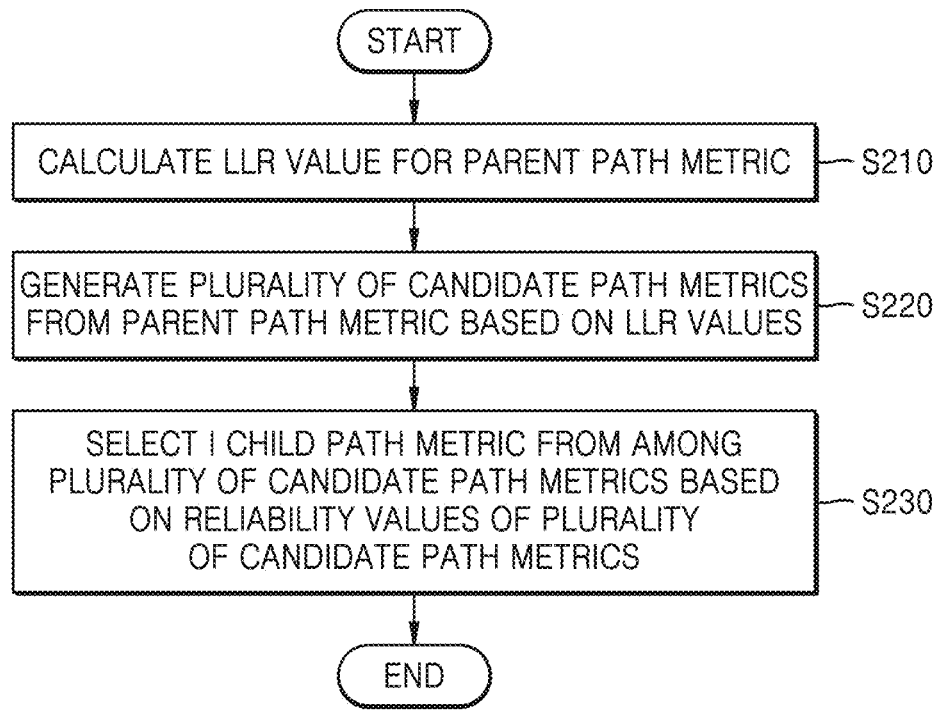
FIG. 7 is a flowchart illustrating a method of operating a path metric processor, according to example embodiments.

FIG. 7 is a flowchart illustrating a method of operating a path metric processor, according to example embodiments.

Referring to FIGS. 6 and 7, the path metric processor 310 may calculate the LLR value v_LLR for the parent path metric pPM (S210). The path metric processor 310 may generate a plurality of candidate path metrics Cd_1 to Cd_k from the parent path metric pPM by decoding candidate data based on the LLR value v_LLR (S220). The path metric processor 310 may select the l child path metrics cPM_1 to cPM_l from among the plurality of candidate path metrics Cd_1 to Cd_k based on reliability values of the plurality of candidate path metrics Cd_1 to Cd_k (S230).

In example embodiments, the number of child path metrics cPM_1 to cPM_l (that is, l) output by the path metric processor 310 may be determined depending upon the path metric processor 310. When the parent path metric pPM received by the path metric processor 310 falls within a high-reliability group, the number of child path metrics cPM_1 to cPM_l (that is, l) may be determined to be relatively high, and when the parent path metric pPM received by the path metric processor 310 falls within a low-reliability group, the number of child path metrics cPM_1 to cPM_l (that is, l) may be determined to be relatively low.

For example, when the parent path metric pPM received by the path metric processor 310 falls within a high-reliability group, the number of child path metrics cPM_1 to cPM_l (that is, l) may be greater than '2'; when the parent path metric pPM received by the path metric processor 310 falls within a medium-reliability group, the number of child path metrics cPM_1 to cPM_l (that is, l) may be '2'; and when the parent path metric pPM received by the path metric processor 310 falls within a low-reliability group, the number of child path metrics cPM_1 to cPM_l (that is, l) may be '1'.

Figure 8:
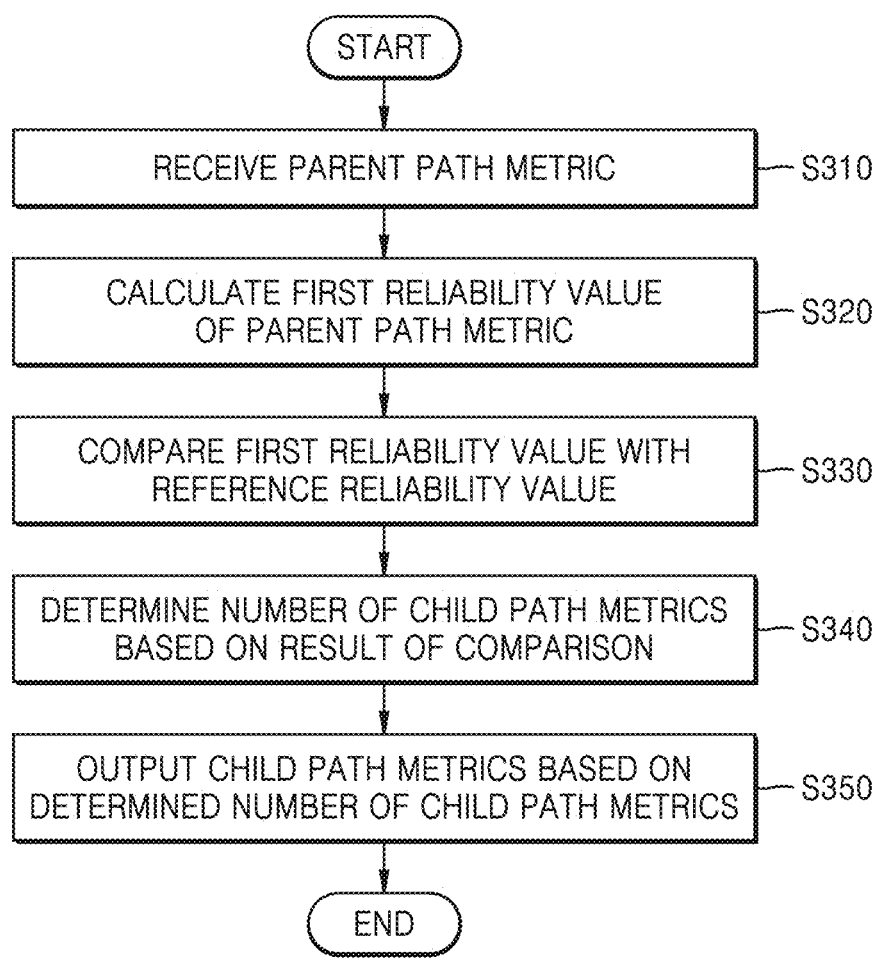
FIG. 8 is a flowchart illustrating operations of a path metric processor, according to example embodiments.

FIG. 8 is a flowchart illustrating operations of a path metric processor, according to example embodiments. In particular, FIG. 8 illustrates example embodiments in which a path metric processor adaptively determines the number of child path metrics.

Referring to FIGS. 6 and 8, the path metric processor 310 may receive the parent path metric pPM (S310). The path metric processor 310 may calculate a first reliability value of the parent path metric pPM (S320). The path metric processor 310 may compare the first reliability value of the parent path metric pPM with a determined reference reliability value (S330) and may determine the number of child path metrics based on a result of the comparison set forth above (S340).

In one example, the path metric processor 310 may determine the number of child path metrics as a first value when the first reliability value of the parent path metric pPM is equal to or greater than the reference reliability value and may determine the number of child path metrics as a second value that is less than the first value when the first reliability value of the parent path metric pPM is less than the reference reliability value.

For example, the path metric processor 310 may determine the number of child path metrics as a first value when the first reliability value of the parent path metric pPM is equal to or greater than a first reference reliability value, may determine the number of child path metrics as a second value that is less than the first value when the first reliability value of the parent path metric pPM is less than the first reference reliability value and equal to or greater than a second reference reliability value, and may determine the number of child path metrics as a third value that is less than the second value when the first reliability value of the parent path metric pPM is less than the second reference reliability value.

The path metric processor 310 may output some of the plurality of candidate path metrics Cd_1 to Cd_k, which are generated from the parent path metric pPM, as the child path metrics cPM_1 to cPM_l based on the determined number of child path metrics (S340).

Figure 9:
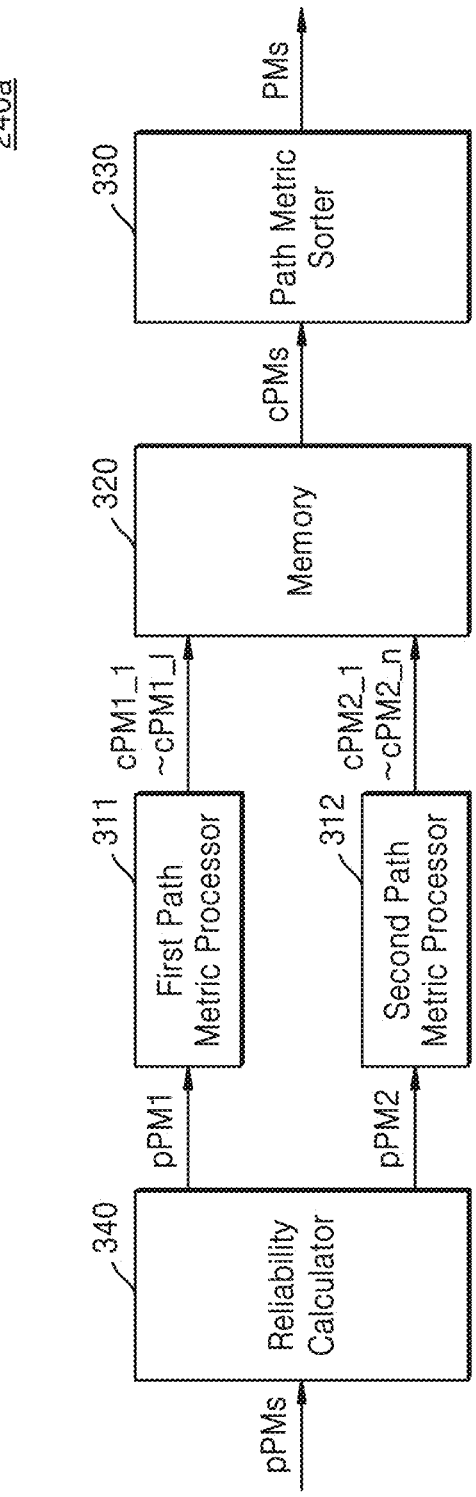
FIG. 9 is a block diagram illustrating a decoder including a reliability calculator according to example embodiments.

FIG. 9 is a block diagram illustrating a decoder including a reliability calculator according to example embodiments. Repeated descriptions given with reference to FIG. 2 will be omitted.

Referring to FIG. 9, a decoder 240a may include the first path metric processor 311, the second path metric processor 312, the memory 320, the path metric sorter 330, and a reliability calculator 340. Since the first path metric processor 311, the second path metric processor 312, the memory 320, and the path metric sorter 330 have been described with reference to FIG. 2, descriptions thereof will be omitted. In example embodiments, the reliability calculator 340 may be implemented using processing circuitry. According to some example embodiments, the reliability calculator 340 may be implemented using at least one first processor configured to executed corresponding computer-readable instructions, and the path metric sorter 330 may be implemented using at least one second processor configured to executed corresponding computer-readable instructions. In example embodiments, the at least one first processor may be similar to or the same as any or all of the at least one second processor, the first path metric processor 311, the second path metric processor 312 and/or the third path metric processor 313. In example embodiments, the at least one first processor may be different from any or all of the at least one second processor, the first path metric processor 311, the second path metric processor 312 and/or the third path metric processor 313. In example embodiments, the at least one second processor may be different from any or all of the at least one first processor, the first path metric processor 311, the second path metric processor 312 and/or the third path metric processor 313.

The reliability calculator 340 may receive a plurality of path metrics pPMs and may calculate a reliability value of each of the plurality of path metrics pPMs. In example embodiments, the reliability value of each of the plurality of path metrics pPMs may be calculated based on LLR values of bits included in each path metric. The reliability calculator 340 may output the plurality of path metrics pPMs (e.g., pPM1 and pPM2) to the first path metric processor 311 and the second path metric processor 312 based on reliability values of the plurality of path metrics pPMs.

For example, the number of first child path metrics cPM1_1 to cPM1_l output by the first path metric processor 311 may be greater than the number of second child path metrics cPM2_1 to cPM2_n output by the second path metric processor 312, and the reliability calculator 340 may output the first parent path metric pPM1 having a relatively high reliability value to the first path metric processor 311 and output the second parent path metric pPM2 having a relatively low reliability value to the second path metric processor 312.

Figure 10:
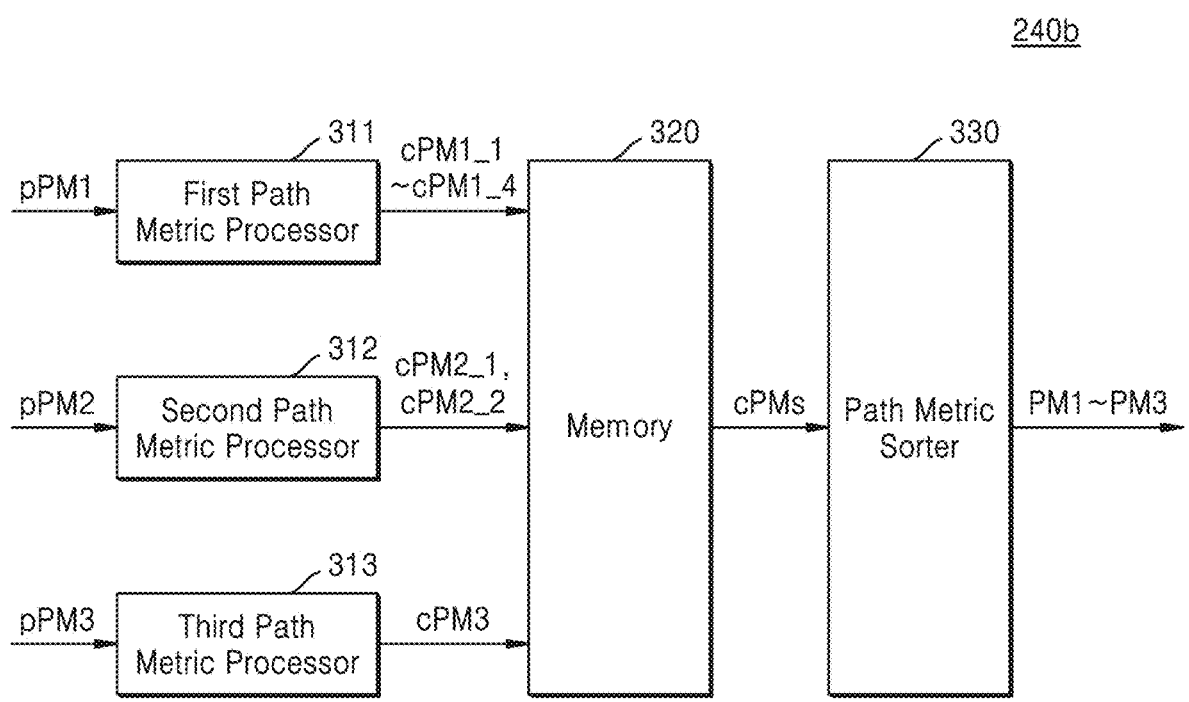
FIG. 10 is a block diagram illustrating a decoder including three metric path processors according to example embodiments.

FIG. 10 is a block diagram illustrating a decoder including three metric path processors according to example embodiments. Repeated descriptions given with reference to FIG. 2 will be omitted.

Referring to FIG. 10, a decoder 240b may include the first path metric processor 311, the second path metric processor 312, a third path metric processor 313, the memory 320, and the path metric sorter 330. According to some example embodiments, the third path metric processor 313 may be implemented using processing circuitry.

The first path metric processor 311 may receive the first parent path metric pPM1 and may output four first child path metrics cPM1_1 to cPM1_4 to the memory 320. The second path metric processor 312 may receive the second parent path metric pPM2 and may output two second child path metrics cPM2_1 and cPM2_2 to the memory 320. The third path metric processor 313 may receive a third parent path metric pPM3 and may output one third child path metric cPM3 to the memory 320. In example embodiments, the first parent path metric pPM1 may have a higher reliability value than the second parent path metric pPM2, and the second parent path metric pPM2 may have a higher reliability value than the third parent path metric pPM3.

The path metric sorter 330 may select three path metrics PM1 to PM3 from among seven child path metrics cPMs including the first child path metrics cPM1_1 to cPM1_4, the second child path metrics cPM2_1 and cPM2_2, and the third child path metric cPM3, based on reliability values of the seven child path metrics cPMs.

In conventional decoders, a fixed number of child path metrics are determined from respective parent path metrics regardless of the reliability of each of the parent path metrics. As a result, the conventional decoders fail to produce reliable path metrics and waste decoder resources processing unreliable parent path metrics. However, according to the inventive concepts, different numbers of child path metrics are determined according to reliability values of the respective parent path metrics (e.g., parent path metrics pPM1, pPM2, and pPM3), with a greater proportion of the resulting child path metrics being generated from more reliable parent path metrics. Accordingly, the reliability of the path metrics (e.g., path metrics PM1 to PM3) generated as a result of decoding may be more reliable than that of the conventional decoders.

In addition, according to example embodiments, the number of child path metrics generated from unreliable parent path metrics is reduced or eliminated. Accordingly, the reliability of the decoding result may be improved, decoding efficiency may be improved, an amount of space in the memory 320 used to store the child path metrics may be reduced, and other resources used by the path metric processor 310, decoder 240b, and/or the path metric sorter 330 (e.g., processor utilization, power consumption, size of decoder, etc.) may also be reduced.

Although example embodiments, in which the first path metric processor 311 outputs the four first child path metrics cPM1_1 to cPM1_4, the second path metric processor 312 outputs the two second child path metrics cPM2_1 and cPM2_2, and the third path metric processor 313 outputs the one third child path metric cPM3, are shown in FIG. 10, this is merely an example, and it will be understood that numbers of child path metrics output respectively by the path metric processors 311, 312, and 313 may be different from those discussed in association with FIG. 10.

Figure 11:
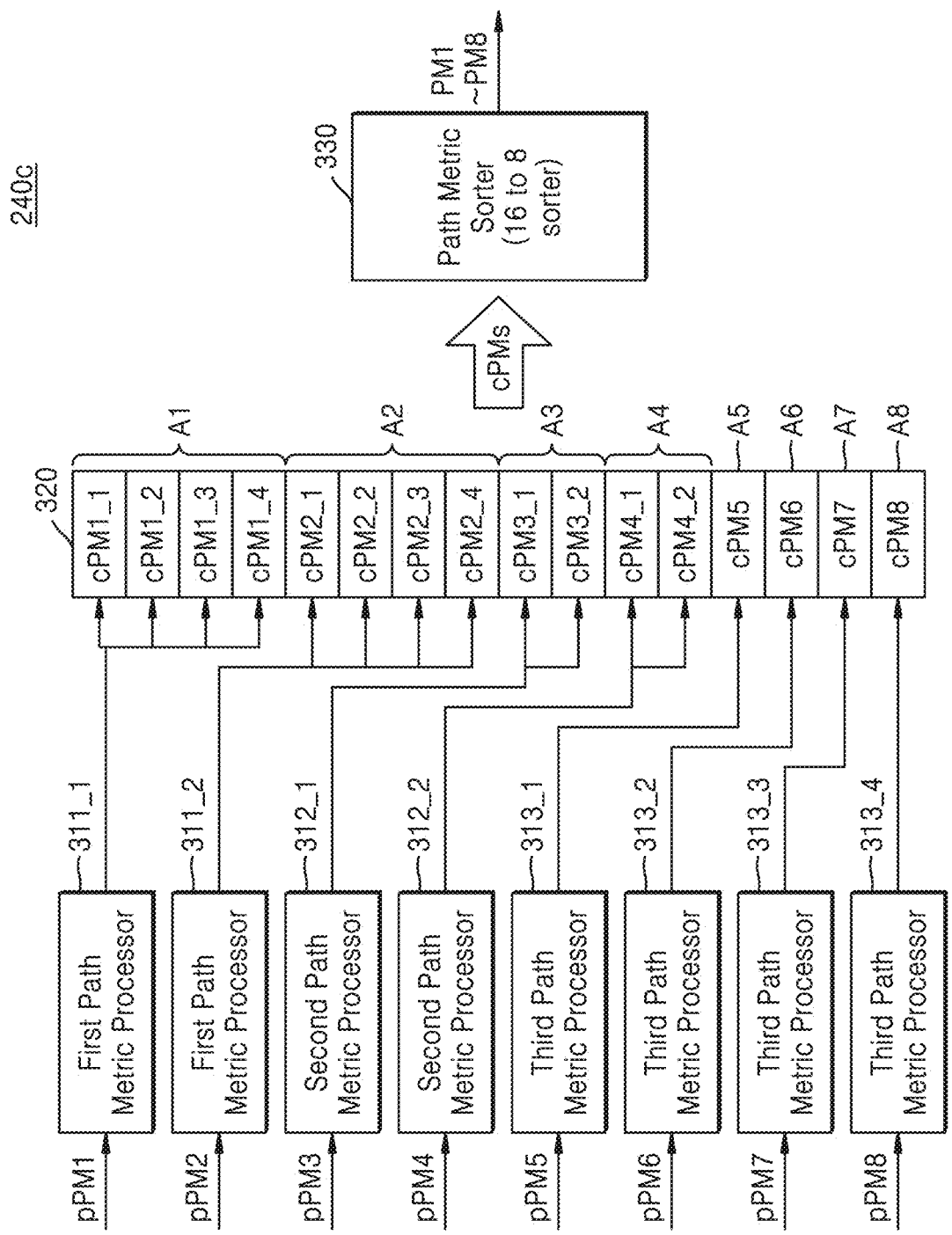
FIG. 11 is a block diagram illustrating a decoder including a 16 to 8 path metric sorter according to example embodiments.

FIG. 11 is a block diagram illustrating a decoder including a 16 to 8 path metric sorter according to example embodiments. Repeated descriptions given with reference to FIG. 10 will be omitted.

Referring to FIG. 11, a decoder 240c may include two first path metric processors 311_1 and 311_2, two second path metric processors 312_1 and 312_2, four third path metric processors 313_1, 313_2, 313_3, and 313_4, the memory 320, and the path metric sorter 330. Each of the two first path metric processors 311_1 and 311_2, the two second path metric processors 312_1 and 312_2, and the four third path metric processors 313_1, 313_2, 313_3, and 313_4, are similar to or the same as the first path metric processor 311, the second path metric processor 312, and the third path metric processor 313, respectively, described with reference to FIG. 10. Accordingly, separate descriptions thereof will be omitted.

The two first path metric processors 311_1 and 311_2 may generate four child path metrics cPM1_1 to cPM1_4 and four child path metrics cPM2_1 to cPM2_4 from parent path metrics pPM1 and pPM2 in the manner of generating four child path metrics per first path metric processor. The first path metric processors 311_1 and 311_2 may store the generated four child path metrics cPM1_1 to cPM1_4 and the generated four child path metrics cPM2_1 to cPM2_4 in a first area A1 and a second area A2 of the memory 320, respectively (e.g., the first path metric processors 311_1 and 311_2 may provide the generated child path metrics to the memory 320 for storage therein).

The two second path metric processors 312_1 and 312_2 may generate two child path metrics cPM3_1 and cPM3_2 and two child path metrics cPM4_1 and cPM4_2 from parent path metrics pPM3 and pPM4 in the manner of generating two child path metrics per second path metric processor. The second path metric processors 312_1 and 312_2 may store the generated two child path metrics cPM3_1 and cPM3_2 and the two child path metrics cPM4_1 and cPM4_2 in a third area A3 and a fourth area A4 of the memory 320, respectively.

The four third path metric processors 313_1 to 313_4 may generate child path metrics cPM5 to cPM8 from parent path metrics pPM5 to pPM8 in the manner of generating one child path metric per third path metric processor. The third path metric processors 313_1 to 313_4 may store the generated child path metrics cPM5 to cPM8 in fifth to eighth areas A5 to A8 of the memory 320, respectively.

According to example embodiments, storage spaces of areas of the memory 320 respectively assigned to path metric processors may be different from each other. For example, the first path metric processors 311_1 and 311_2, which respectively generate the four child path metrics cPM1_1 to cPM1_4 and the four child path metrics cPM2_1 to cPM2_4, may be respectively assigned the first area A1 and the second area A2, each having a storage space capable of storing four child path metrics; the second path metric processors 312_1 and 312_2, which respectively generate the two child path metrics cPM3_1 and cPM3_2 and the two child path metrics cPM4_1 and cPM4_2, may be respectively assigned the third area A3 and the fourth area A4, each having a storage space capable of storing two child path metrics; and the third path metric processors 313_1 to 313_4, which respectively generate the child path metrics cPM5 to cPM8, may be respectively assigned the fifth to eighth areas A5 to A8, each having a storage space capable of storing one child path metric.

According to the inventive concepts, different memory areas A1 to A8 are respectively assigned according to reliabilities of the parent path metrics pPM1 to pPM8, whereby a storage space of the memory 320 used for decoding may be reduced.

In addition, the path metric sorter 330 may include a 16-to-8 sorter receiving 16 child path metrics cPMs and outputting 8 path metrics PM1 to PM8. According to example embodiments, the first path metric processors 311_1 and 311_2, which each output the greatest number of child path metrics, may respectively generate the four child path metrics cPM1_1 to cPM1_4 and the four child path metrics cPM2_1 to cPM2_4, and the number of child path metrics cPMs (that is, 16) received by the path metric sorter 330 may be less than the product (that is, 32) of the number of path metric processors (that is, 8) and the number of child path metrics cPM1_1 to cPM1_4 or cPM2_1 to cPM2_4 (that is, 4) output by each of the first path metric processors 311_1 and 311_2.

Thus, the path metric sorter 330 may include the 16-to-8 sorter that uses relatively less resources than a 32-to-8 sorter that would be used in the case where each of all the path metric processors output 4 child path metrics. That is, as a relatively small number of child path metrics are generated when each of the parent path metrics pPM1 to pPM8 have low reliability, resources consumed by the path metric sorter 330 may be reduced and the size of the decoder 240c may also be reduced.

Although FIG. 11 illustrates the two first path metric processors 311_1 and 311_2, the two second path metric processors 312_1 and 312_2, and the four third path metric processors 313_1, 313_2, 313_3, and 313_4, this is merely an example, and it will be understood that the numbers of respective types of path metric processors may be different from those in the case of FIG. 11.

Figure 12:
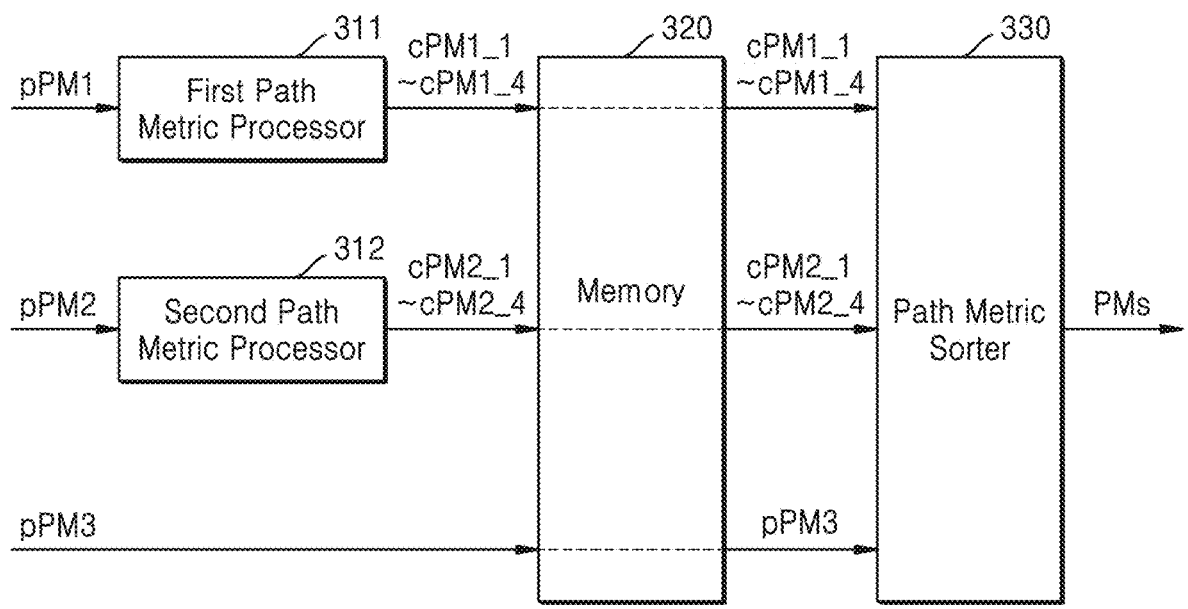
FIG. 12 is a block diagram illustrating a decoder in which a parent path metric is stored in memory without being used to generate child path metrics according to example embodiments.

FIG. 12 is a block diagram illustrating a decoder in which a parent path metric is stored in memory without being used to generate child path metrics according to example embodiments. Repeated descriptions given with reference to FIG. 2 will be omitted.

Referring to FIG. 12, a decoder 240d may include the first path metric processor 311, the second path metric processor 312, the memory 320, and the path metric sorter 330. The first path metric processor 311 may receive the first parent path metric pPM1 and may store, in the memory 320, the four first child path metrics cPM1_1 to cPM1_4 generated thereby from the first parent path metric pPM1, and the second path metric processor 312 may receive the second parent path metric pPM2 and may store, in the memory 320, the four second child path metrics cPM2_1 to cPM2_4 generated thereby from the second parent path metric pPM2. On the other hand, no child path metrics are generated from the third parent path metric pPM3, and the third parent path metric pPM3 may be directly stored in the memory 320 (e.g., without previously being used to generate child path metrics). In example embodiments, the third parent path metric pPM3 may have lower reliability than each of the first parent path metric pPM1 and the second parent path metric pPM2.

The path metric sorter 330 may select the plurality of path metrics PMs from among a plurality of child path metrics cPM1_1 to cPM1_4 and cPM2_1 to cPM2_4 and the third parent path metric pPM3, which are received from the memory 320. Although not shown, in example embodiments, the LLR calculator (for example, 352 of FIG. 6) may calculate an LLR value corresponding to the third parent path metric pPM3, as described with reference to FIG. 6, and the plurality of path metrics PMs may be selected based thereon.

According to example embodiments, the decoder 240d may not perform a process of generating child path metrics for the parent path metric pPM3 having low reliability, and thus, decoding efficiency may be improved.

Figure 13:
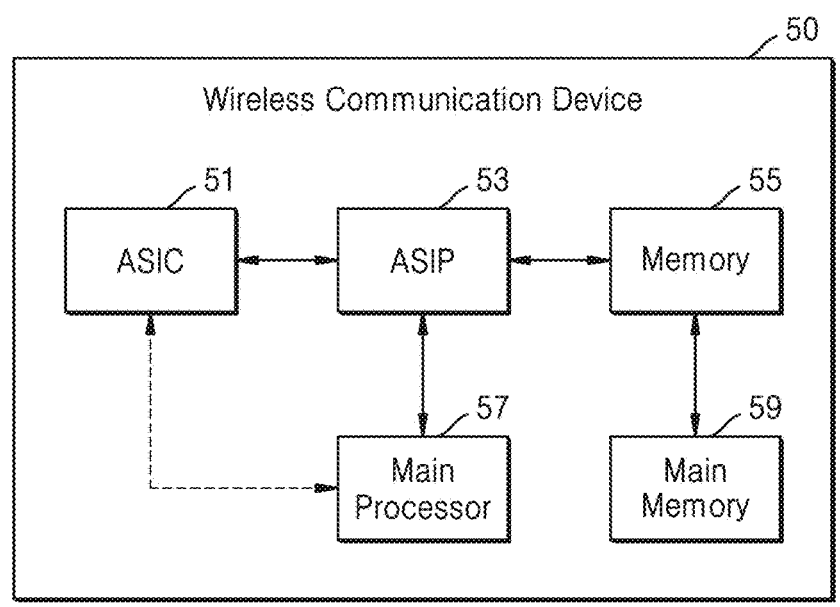
FIG. 13 is a block diagram illustrating a wireless communication device according to example embodiments.

FIG. 13 is a block diagram illustrating a wireless communication device according to example embodiments. As shown in FIG. 13, a wireless communication device 50 may include an application-specific integrated circuit (ASIC) 51, an application-specific instruction set processor (ASIP) 53, a memory 55, a main processor 57, and a main memory 59. Two or more of the ASIC 51, the ASIP 53, and the main processor 57 may communicate with each other. In addition, at least two of the ASIC 51, the ASIP 53, the memory 55, the main processor 57, and the main memory 59 may be embedded in one chip.

The ASIP 53, which is an integrated circuit customized for a specific purpose, may support a instruction set used for a specific application and may execute instructions included in the instruction set. The memory 55 may communicate with the ASIP 53 and, as a non-transitory storage device, may store a plurality of instructions executed by the ASIP 53. For example, the memory 55 may include, without limitation, any type of memory accessible by the ASIP 53, such as random access memory (RAM), read only memory (ROM), tape, a magnetic disk, an optical disk, volatile memory, non-volatile memory, and a combination thereof.

The main processor 57 may control the wireless communication device 50 by executing the plurality of instructions. For example, the main processor 57 may control the ASIC 51 and the ASIP 53 and may process data received via a wireless communication network or process a user input for the wireless communication device 50. The main memory 59 may communicate with the main processor 57 and, as a non-transitory storage device, may store the plurality of instructions executed by the main processor 57. For example, the main memory 59 may include, without limitation, any type of memory accessible by the main processor 57, such as RAM, ROM, tape, a magnetic disk, an optical disk, volatile memory, non-volatile memory, and a combination thereof.

The encoding and/or decoding method according to example embodiments, which has been described above, may be performed by at least one of the components included in the wireless communication device 50 of FIG. 13. In example embodiments, at least one of the operations of the encoding and/or decoding method described above may be implemented as the plurality of instructions stored in the memory 55. In example embodiments, the ASIP 53 executes the plurality of instructions stored in the memory 55, whereby the at least one of the operations of the encoding and/or decoding method may be performed. In example embodiments, the at least one of the operations of the encoding and/or decoding method may be implemented as a hardware block designed by logic synthesis or the like and thus be included in the ASIC 51. In example embodiments, the at least one of the operations of the encoding and/or decoding method may be implemented as the plurality of instructions stored in the main memory 59, and the main processor 57 executes the plurality of instructions stored in the main memory 59, whereby the at least one of the operations of the encoding and/or decoding method may be performed.

The various operations of methods described above may be performed by any suitable device capable of performing the operations, such as processing circuitry. Software (also referred to herein as "software blocks") may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or operations of a method or algorithm and functions described in connection with the example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the inventive concepts have been particularly shown and described with reference to example embodiments thereof, it will be understood by one of ordinary skill in the art that various changes in form and details may be made therein without departing from the spirit and scope of the following claims. In addition, it should be understood that particular terms used herein are only for the purpose of describing the example embodiments and are not intended to limit the inventive concepts. Therefore, the scope of the inventive concepts should be defined by the accompanying claims and equivalents thereof.

What is claimed is:

1. A device for decoding input data comprising first candidate data and second candidate data by using a polar code, the device comprising:
a plurality of path metric processors, including
a first path metric processor configured to
generate a plurality of first candidate path metrics based on a first parent path metric by decoding the first candidate data,
determine at least one first child path metric from among the plurality of first candidate path metrics based on first reliability values of the plurality of first candidate path metrics; and
a second path metric processor configured to
generate a plurality of second candidate path metrics based on a second parent path metric by decoding the second candidate data, and
determine at least one second child path metric from among the plurality of second candidate path metrics based on second reliability values of the plurality of second candidate path metrics, a quantity of the at least one first child path metric being different from a quantity of the at least one second child path metric.

2. The device according to claim 1, wherein the first path metric processor is configured to:
calculate LLR values of the plurality of first candidate path metrics; and
determine the at least one first child path metric from among the plurality of first candidate path metrics based on the LLR values of the plurality of first candidate path metrics.

3. The device according to claim 1, wherein
each reliability value among the first reliability values and the second reliability values represents to a degree of correspondence of a path metric to a bit sequence output from a transmission stage,
a reliability value of the first parent path metric is higher than a reliability value of the second parent path metric, and
the quantity of the at least one first child path metric is greater than the quantity of the at least one second child path metric.

4. The device according to claim 3, further comprising:
at least one first processor configured to output a plurality of parent path metrics to the first path metric processor and the second path metric processor based on reliability values of the plurality of parent path metrics, the plurality of parent path metrics comprising the first parent path metric and the second parent path metric.

5. The device according to claim 4, wherein the at least one first processor is configured to calculate the reliability values of the plurality of parent path metrics based on log likelihood ratio (LLR) values of the plurality of parent path metrics.

6. The device according to claim 3, wherein
the plurality of path metric processors includes a third path metric processor configured to
generate a plurality of third candidate path metrics based on a third parent path metric, and
determine at least one third child path metric from among the plurality of third candidate path metrics based on reliability values of the plurality of third candidate path metrics, the reliability value of the second parent path metric is higher than a reliability value of the third parent path metric, and
the quantity of the at least one second child path metric is greater than a quantity of the at least one third child path metric.

7. The device according to claim 6, wherein
the quantity of the at least one first child path metric is a natural number greater than 2,
the quantity of the at least one second child path metric is 2, and
the quantity of the at least one third child path metric is 1.

8. The device according to claim 3, further comprising:
a memory comprising
a first area storing the at least one first child path metric, and
a second area storing the at least one second child path metric,
wherein a storage space of the first area is larger than a storage space of the second area.

9. The device according to claim 3, further comprising:
at least one second processor configured to
select a plurality of path metrics from among the at least one first child path metric and the at least one second child path metric, and
output the plurality of path metrics.

10. The device according to claim 9, wherein the at least one second processor is configured to select two path metrics from among the at least one first child path metric and the at least one second child path metric based on reliability values of the at least one first child path metric and the at least one second child path metric.

11. The device according to claim 9, wherein
the at least one second processor is further configured to select a plurality of path metrics from among the at least one first child path metric, the at least one second child path metric, and a third parent path metric, and
a reliability value of the third parent path metric is lower than both of the reliability value of the first parent path metric and the reliability value of the second parent path metric.

12. The device according to claim 1, wherein the first path metric processor is configured to determine the quantity of the at least one first child path metric based on a reliability value of the first parent path metric and a reference reliability value.

13. The device according to claim 1, further comprising:
at least one second processor configured to output a plurality of path metrics selected from among a plurality of child path metrics received from the plurality of path metric processors, the quantity of the at least one first child path metric received from the first path metric processor being equal to or greater than a quantity of child path metrics received from each of the plurality of path metric processors exclusive of the first path metric processor, and a quantity of child path metrics received by the at least one second processor being less than a product of the quantity of the at least one first child path metric and a quantity of the plurality of path metric processors.

14. The device according to claim 1, wherein both of the first parent path metric and the second parent path metric are path metrics for a Rate-1 node having only information bits as child nodes.

15. A device for decoding input data comprising a plurality of pieces of candidate data by using a polar code, the device comprising:
- a plurality of path metric processors, each configured to determine at least one child path metric from among a plurality of candidate path metrics based on reliability values of the plurality of candidate path metrics the plurality of candidate path metrics being generated from a parent path metric by decoding at least one of the plurality of pieces of candidate data; and
- at least one processor configured to output a plurality of path metrics selected from among a plurality of child path metrics received from the plurality of path metric processors, a quantity of at least one first child path metric received from a first path metric processor among the plurality of path metric processors being equal to or greater than a quantity of child path metrics received from each of the plurality of path metric processors exclusive of the first path metric processor, and a quantity of the plurality of child path metrics received by the at least one processor being less than a product of the quantity of the at least one first child path metric and a quantity of the plurality of path metric processors.

16. The device according to claim 15, wherein
each of the reliability values represents to a degree of correspondence of a path metric to a bit sequence output from a transmission stage,
the first path metric processor is configured to
receive a first parent path metric having a first reliability value, and
output the at least one first child path metric,
a second path metric processor among the plurality of path metric processors is configured to
receive a second parent path metric having a second reliability value, and
output at least one second child path metric,
a reliability value of the first parent path metric is higher than a reliability value of the second parent path metric, and
the quantity of the at least one first child path metric is greater than a quantity of at least one second child path metric.

17. The device according to claim 16, further comprising:
a memory comprising
a first area storing the at least one first child path metric, and
a second area storing the at least one second child path metric,
wherein a storage space of the first area is larger than a storage space of the second area.

18. A method of decoding input data by using a polar code, the method comprising:
determining at least one first child path metric from a plurality of first candidate path metrics generated based on a first parent metric, the first parent metric having a first reliability value representing a degree of correspondence of the first parent metric to a bit sequence output from a transmission stage; and
determining at least one second child path metric from a plurality of second candidate path metrics generated based on a second parent metric, the second parent metric having a second reliability value representing a degree of correspondence of the second parent metric to a bit sequence output from a transmission stage, the first reliability value being higher than the second reliability value, and a quantity of the at least one first child path metric being greater than a quantity of the at least one second child path metric.

19. The method according to claim 18, further comprising:
determining at least two path metrics from among the at least one first child path metric and the at least one second child path metric, the determining the at least two path metrics comprises selecting the at least two path metrics based on log likelihood ratio (LLR) values of the at least one first child path metric and the at least one second child path metric.

20. The method according to claim 18, further comprising:
calculating the first reliability value and the second reliability value; and
arranging the first parent metric and the second parent metric based on the first reliability value and the second reliability value.

* * * * *